(12) United States Patent
Kuan et al.

(10) Patent No.: US 9,853,650 B1
(45) Date of Patent: Dec. 26, 2017

(54) METHOD AND APPARATUS OF FREQUENCY SYNTHESIS

(71) Applicant: Realtek Semiconductor Corp., Hsinchu (TW)

(72) Inventors: Chi-Kung Kuan, Taoyuan County (TW); Yu Zhao, San Jose, CA (US); Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/356,796

(22) Filed: Nov. 21, 2016

(51) Int. Cl.
*H03L 7/099* (2006.01)
*H03L 7/087* (2006.01)

(52) U.S. Cl.
CPC ............ *H03L 7/0992* (2013.01); *H03L 7/087* (2013.01)

(58) Field of Classification Search
CPC ....... H03L 7/0992; H03L 7/087; H03L 7/085; H03L 7/091; H03L 7/0991; H03L 7/093; H03L 7/23; H03L 5/00; H03L 7/06
USPC ......... 327/147, 156, 158; 375/371, 375, 376
See application file for complete search history.

(56) References Cited

U.S. PATENT DOCUMENTS

| | | | | |
|---|---|---|---|---|
| 7,714,668 B2 * | 5/2010 | Yoshida | ................... | H03L 7/087 327/156 |
| 9,432,025 B1 * | 8/2016 | Khor | ........................ | H03L 7/085 |
| 9,705,512 B1 * | 7/2017 | Kuan | ..................... | H03L 7/0891 |
| 2009/0163166 A1 * | 6/2009 | Lin | ........................... | H03L 7/07 455/260 |
| 2011/0133799 A1 * | 6/2011 | Dunworth | ............... | H03L 7/089 327/157 |

\* cited by examiner

*Primary Examiner* — John Poos
(74) *Attorney, Agent, or Firm* — McClure, Qualey & Rodack, LLP

(57) ABSTRACT

An apparatus having a digitally controlled timing adjustment circuit configured to receive a first clock and a second clock and output a third clock and a fourth clock in accordance with a noise cancellation signal and a gain control signal, an analog phase detector configured to receive the third clock and the fourth clock and output an analog timing error signal, a filtering circuit configure to receive the analog timing error signal and output an oscillator control signal, a controllable oscillator configured to receive the oscillator control signal and output a fifth clock, a clock divider configured to receive the fifth clock and output the second clock in accordance with a division factor, a modulator configured to receive a clock multiplication factor and output the division factor and the noise cancellation signal, wherein a mean value of the division factor is equal to the clock multiplication factor, a digital phase detector configured to receive the third clock and the fourth clock and output a digital timing error signal, wherein the digital phase detector is self-calibrated so that a mean value of the digital timing error signal is zero, and a correlation circuit configured to receive the timing error signal and the noise cancellation signal and output the gain control signal.

20 Claims, 7 Drawing Sheets

METHOD AND APPARATUS OF FREQUENCY SYNTHESIS

BACKGROUND OF THE INVENTION

Field of the Invention

The present invention generally relates to phase lock loops.

Description of Related Art

Persons of ordinary skills in the art understand terms and basic concepts related to microelectronics that are used in this disclosure, such as "voltage," "current," "signal," "logical signal," "clock," "rising edge," "phase," "capacitor," "charge," "charge pump," "transistor," "MOS (metal-oxide semiconductor)," "PMOS (p-channel metal oxide semiconductor)," "NMOS (n-channel metal oxide semiconductor)," "source," "gate," "drain," "circuit node," "ground node," "switch," "inverter," "time-to-digital converter," "digital-to-analog converter," and "digital-to-time converter." Terms and basic concepts like these are apparent to those of ordinary skills in the art and thus will not be explained in detail here.

Through this disclosure, a logical signal is a signal of two states: "high" and "low," which can also be re-phrased as "1" and "0." For brevity, a logical signal in the "high" ("low") state is simply stated as the logical signal is "high" ("low"), or alternatively, the logical signal is "1" ("0"). Also, for brevity, quotation marks may be omitted and the immediately above is simply stated as the logical signal is high (low), or alternatively, the logical signal is 1 (0), with the understanding that the statement is made in the context of describing a state of the logical signal.

A logical signal is said to be asserted when it is high. A logical signal is said to be de-asserted when it is low.

A clock signal is a cyclic logical signal. For brevity, hereafter, "clock signal" may be simply referred to as "clock."

A timing of a clock signal refers to a time instant where the clock signal undergoes a transition of state, either a low-to-high transition or a high-to-low transition. When a clock signal undergoes a low-to-high (high-to-low) transition, a rising (falling) edge is observed in a timing diagram.

As is known, a phase lock loop (PLL) receives a first clock and outputs a second clock such that a phase of the second clock tracks a phase of the first clock. As a result, a frequency of the second clock is determined by a frequency of the first clock. A prior art phase lock loop comprises a phase/frequency detector (hereafter PFD), a charge pump (hereafter CP) circuit, a loop filter (hereafter LF), a voltage-controlled oscillator (hereafter VCO), and a clock divider circuit, wherein: the VCO outputs the second clock in accordance with a control voltage such that the frequency of the second clock is determined by the control voltage, the clock divider circuit receives the second clock and outputs a third clock in accordance with a division ratio, the PFD receives the first clock and the third clock and outputs a timing signal representing a difference in timing between the first clock and the third clock, the CP circuit converts the timing signal into a current signal, the LF filters the current signal to establish the control voltage to control the frequency of the second clock. The frequency of the second clock is thus adjusted in a closed loop manner to track a frequency of the first clock. "Phase/frequency detector," "charge pump circuit," "loop filter," "voltage-controlled oscillator," and "clock divider circuit" are all well known in the prior art and thus not described in detail here. In a steady state, the frequency of the second clock is equal to the frequency of the first clock multiplied by a multiplication factor N that can be expressed as $$N = N_{int} + \alpha$$

where $N_{int}$ is a positive integer and $\alpha$ is a rational number smaller than 1 (one) but not smaller than 0 (zero). If $\alpha$ is zero, the clock divider circuit has a fixed division factor $N_{int}$, i.e. it performs a "divide by $N_{int}$" function wherein one cycle of the third clock is output for every $N_{int}$ cycles of the second clock. If $\alpha$ is nonzero, it must be a fractional number; in this case, the phase lock loop is referred to as "fractional-N PLL," and the clock divider circuit cannot have a fixed division factor. In an embodiment, the division factor of the clock divider circuit is modulated by a delta-sigma modulator and dynamically toggle between $N_{int}$ and $N_{int}+1$ such that a mean value of the division factor is equal to $N_{int}+\alpha$. Since the value of the division factor is modulated, an instantaneous value differs from a mean value of the division factor (e.g., $N_{int}$ and $N_{int}+1$ are different from $N_{int}+\alpha$), resulting in an instantaneous noise additive to the PLL. In U.S. Pat. No. 7,999,622, Galton et al disclosed a method to cancel the additive noise resulting from the modulation of the division factor. The method is based on using a digital-to-analog converter to output a current that offsets an additive noise in the output of the charge pump circuit (resulting from the modulation of the division factor). The digital-to-analog converter (DAC), however, contributes thermal noise. To reduce the thermal noise contribution, a large current can be used at the cost of high power consumption. Besides, in practice the DAC is not perfectly linear, and its nonlinearity can contribute additional noise to PLL. To reduce the adverse effect of the nonlinearity of the DAC, a dynamic element matching can be used at the cost of high circuit complexity.

BRIEF SUMMARY OF THIS INVENTION

What is desired and disclosed herein is a method for cancelling a noise in a fractional-N PLL resulting from a modulation of a division factor without consuming high power or demanding high circuit complexity.

An aspect of the present invention is to use a digitally controlled timing adjustment circuit to correct a pre-known timing error in a fractional-N phase lock loop due to a modulation of a division factor of a clock divider, wherein a gain of the digitally controlled timing adjustment circuit is calibrated in a closed-loop manner based upon a correlation between the pre-known timing error and a residual timing error of an output of the digitally controlled timing adjustment circuit.

In an embodiment, an apparatus comprises: a digitally controlled timing adjustment circuit configured to receive a first clock and a second clock and output a third clock and a fourth clock in accordance with a noise cancellation signal and a gain control signal; an analog phase detector configured to receive the third clock and the fourth clock and output an analog timing error signal; a filtering circuit configure to receive the analog timing error signal and output an oscillator control signal; a controllable oscillator configured to receive the oscillator control signal and output a fifth clock; a clock divider configured to receive the fifth clock and output the second clock in accordance with a division factor; a modulator configured to receive a clock multiplication factor and output the division factor and the noise cancellation signal; a digital phase detector configured to receive the third clock and the fourth clock and output a digital timing error signal, wherein the digital phase detector is self-calibrated so that a mean value of the digital timing error signal is zero; and a correlation circuit configured to receive the digital timing error signal and the noise cancellation signal and output the gain control signal. In an embodiment, a timing difference between the fourth clock and the third clock is equal to a sum of: a timing difference between the second clock and the first clock, the noise cancellation signal scaled by the gain control signal, and a timing offset. In an embodiment, the digitally controlled timing adjustment circuit comprises: a fixed-delay circuit configured to receive the second clock and output the fourth clock, and a digitally controlled variable-delay circuit configured to receive the first clock and output the third clock in accordance with the noise cancellation signal and the gain control signal. In an embodiment, a delay of the digitally controlled variable delay circuit is linearly dependent on the noise cancellation signal and also linearly dependent on the gain control signal. In an embodiment, the digitally controlled variable delay circuit comprises: a tunable inverter comprising an inverter supplied by a rail voltage controlled by the gain control signal, and a variable capacitor controlled by the noise cancellation signal.

In an embodiment, the digital phase detector comprises: a skew adjustment circuit configured to receive the third clock and the fourth clock and output a first delayed clock and a second delayed clock in accordance with a delay control signal, a time-to-digital converter configured to receive the first delayed clock and the second delay clock and output the digital timing error signal, and an integrator configured to receive the digital timing error signal and output the delay control signal. In an embodiment, the correlation circuit comprises a digital signal processing unit configured to decrement the gain control signal by a value determined by the digital timing error signal if the noise cancellation signal is positive, increment the gain control signal by the value determined by the digital timing error signal if the noise cancellation signal is negative, or make no changes to the gain control signal if the noise cancellation signal is zero. In an embodiment, the modulator comprises a delta-sigma modulator. In an embodiment, the modulator comprises a first order delta-sigma modulator. In an embodiment, the analog phase detector comprises a phase/frequency detector. In an embodiment, the filtering circuit comprises a charge pump and a load circuit comprising a serial connection of a capacitor and a resistor. In an embodiment, the controllable oscillator is a voltage-controlled oscillator. In an embodiment, the clock divider is a counter.

In an embodiment, a method comprises: receiving a first clock and a clock multiplication factor; modulating the clock multiplication factor into a division factor, wherein a mean value of the division factor is equal to the clock multiplication factor; establishing a noise cancellation signal in accordance with a difference between the clock multiplication factor and the division factor; deriving a third clock and a fourth clock from the first clock and a second clock using a digitally controlled timing adjustment circuit in accordance with a noise cancellation signal and a gain control signal; establishing an analog timing error signal by detecting a timing difference between the fourth clock and the third clock using an analog phase detector; filtering the analog timing error signal into an oscillator control signal using a filtering circuit; outputting a fifth clock in accordance with the oscillator control signal using a controllable oscillator; outputting the second clock by dividing down the fifth clock in accordance with the division factor; establishing a digital timing error signal by detecting the timing difference between the fourth clock and the third clock using a digital phase detector that is self-calibrating so that a mean value of the digital timing error signal is zero; and adjusting the gain control signal in accordance with a correlation between the digital timing error signal and the noise cancellation signal. In an embodiment, a timing difference between the fourth clock and the third clock is equal to a sum of: a timing difference between the second clock and the first clock, the noise cancellation signal scaled by the gain control signal, and a timing offset. In an embodiment, the digitally controlled timing adjustment circuit comprises: a fixed-delay circuit configured to receive the second clock and output the fourth clock, and a digitally controlled variable-delay circuit configured to receive the first clock and output the third clock in accordance with the noise cancellation signal and the gain control signal. In an embodiment, a delay of the digitally controlled variable delay circuit is linearly dependent on the noise cancellation signal and also linearly dependent on the gain control signal. In an embodiment, the digitally controlled variable delay circuit comprises: a tunable inverter comprising an inverter supplied by a rail voltage controlled by the gain control signal, and a variable capacitor controlled by the noise cancellation signal. In an embodiment, the digital phase detector comprises: a skew adjustment circuit configured to receive the third clock and the fourth clock and output a first delayed clock and a second delayed clock in accordance with a delay control signal, a time-to-digital converter configured to receive the first delayed clock and the second delay clock and output the digital timing error signal, and an integrator configured to receive the digital timing error signal and output the delay control signal. In an embodiment, the correlation circuit comprises a digital signal processing unit configured to decrement the gain control signal by a value determined by the digital timing error signal if the noise cancellation signal is positive, increment the gain control signal by the value determined by the digital timing error signal if the noise cancellation signal is negative, or make no change to the gain control signal if the noise cancellation signal is zero. In an embodiment, modulating the clock multiplication factor comprises using a delta-sigma modulator. In an embodiment, modulating the clock multiplication factor comprises using a first order delta-sigma modulator. In an embodiment, the analog phase detector comprises a phase/frequency detector. In an embodiment, the filtering circuit comprises a charge pump and a load circuit comprising a serial connection of a capacitor and a resistor. In an embodiment, the controllable oscillator is a voltage-controlled oscillator. In an embodiment, the dividing down the fifth clock comprises using a counter.

DETAILED DESCRIPTION OF THIS INVENTION

The present invention relates to phase lock loops. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Figure 1A:
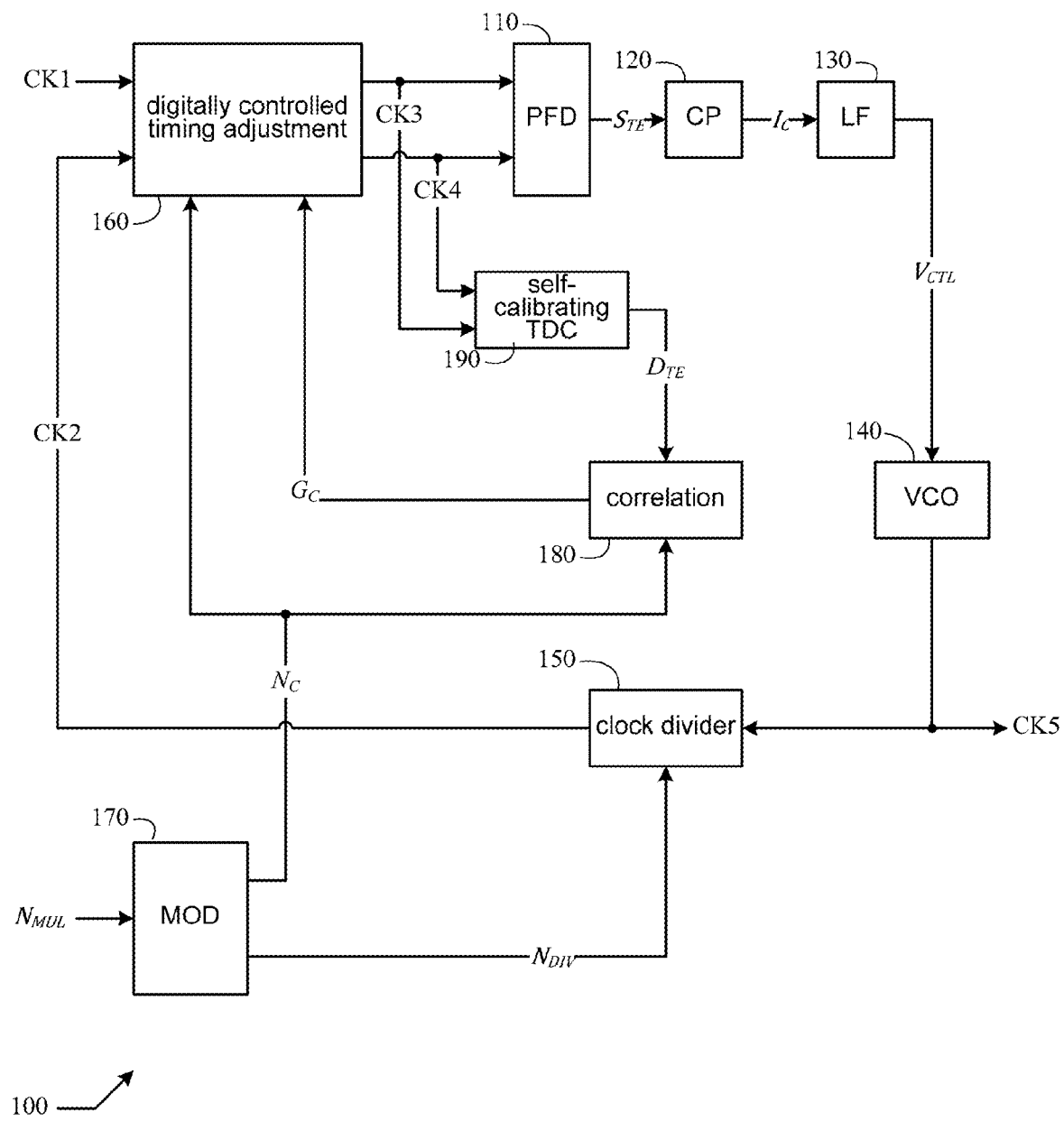
FIG. 1A shows a functional block diagram of a fractional-N phase lock loop in accordance with an embodiment of the present invention.

FIG. 1A shows a functional block diagram of a PLL 100 in accordance with an embodiment of the present invention. PLL 100 comprises: a digitally controlled timing adjustment circuit 160 configured to receive a first clock CK1 and a second clock CK2 and output a third clock CK3 and a fourth clock CK4 in accordance with a noise cancellation signal $N_C$ and a gain control signal $G_C$; a phase/frequency detector (PFD) 110 configured to receive the third clock CK3 and the fourth clock CK4 and output an analog timing error signal $S_{TE}$ representing a timing difference between the third clock CK3 and the fourth clock CK4; a charge pump (CP) 120 configured to convert the analog timing error signal $S_{TE}$ into a correction current $I_C$; a loop filter (LF) 130 configured to receive the correction current $I_C$ and output a control voltage $V_{CTL}$; a voltage-controlled oscillator (VCO) 140 configured to output a fifth clock CK5 in accordance with the control voltage $V_{CTL}$; a clock divider 150 configured to receive the fifth clock CK5 and output the second clock CK2 in accordance with a division factor $N_{DIV}$; a modulator (MOD) 170 configured to output the division factor $N_{DIV}$ and the noise cancellation signal $N_C$ in accordance with a clock multiplication factor $N_{MUL}$; a self-calibrating TDC (time-to-digital converter) 190 configured to receive the third clock CK3 and the fourth clock CK4 and output a digital timing error signal $D_{TE}$, and a correlation circuit 180 configured to output the gain control signal $G_C$ in accordance with a correlation between the digital timing error signal $D_{TE}$ and the noise cancellation signal $N_C$. For brevity, hereafter the first (second, third, fourth, fifth) clock CK1 (CK2, CK3, CK4, CK5) is simply referred to as CK1 (CK2, CK3, CK4, CK5), the analog timing error signal $S_{TE}$ is simply referred to as $S_{TE}$, the digital timing error signal $D_{TE}$ is simply referred to as $D_{TE}$, the correction current $I_C$ is simply referred to as $I_C$, the control voltage $V_{CTL}$ is simply referred to as $V_{CTL}$, the noise cancellation signal $N_C$ is simply referred to as $N_C$, the gain control signal $G_C$ is simply referred to as $G_C$, the clock multiplication factor $N_{MUL}$ is simply referred to as $N_{MUL}$, and the division factor $N_{DIV}$ is simply referred to as $N_{DIV}$.

PLL 100 will be the same as the aforementioned prior art PLL if: the digitally controlled timing adjustment circuit 160, the self-calibration TDC 190, and the correlation circuit 180 are removed, and PFD 110 receives CK1 and CK2, instead of CK3 and CK4. Similar to the prior art PLL, PLL 100 receives CK1 and outputs CK5 using VCO 140, which is adjusted in a closed loop manner via a feedback path comprising the clock divider 150, PFD 110, CP 120, and LF 130, such that a frequency of CK5 is equal to a frequency of CK1 times $N_{MUL}$, which is not a pure integer. Since $N_{MUL}$ is not a pure integer but $N_{DIV}$ (which is the clock division factor of the clock divider 150) needs to be an integer, $N_{DIV}$ must be modulated in a way such that a mean value of $N_{DIV}$ equals $N_{MUL}$. Modulator 170 receives $N_{MUL}$ and outputs $N_{DIV}$, effectively modulating $N_{DIV}$ such that the mean value of $N_{DIV}$ equals $N_{MUL}$. In doing so, the average frequency of CK5 is equal to the frequency of CK1 times $N_{MUL}$, but an instantaneous timing of CK2 might deviate from an ideal timing of a fictitious clock divider that allows a non-integer division factor of $N_{MUL}$. The deviation of the instantaneous timing of CK2 from the ideal timing due to the modulation of $N_{DIV}$ leads to an instantaneous noise in the timing difference between CK2 and CK1. However, the instantaneous noise of the timing difference between CK2 and CK1 due to the modulation of $N_{DIV}$ is pre-known. The instantaneous noise is calculated by the modulator 170 and represented by $N_C$. The digitally controlled timing adjustment circuit 160 is configured to correct the instantaneous noise in the timing difference between CK2 and CK1 due to the modulation of $N_{DIV}$, such the timing difference between CK4 and CK3 is free of the instantaneous noise. However, $N_C$ is numeric and digital in nature, while the timing difference between CK2 and CK1 is temporal and analog in nature. A function of digital-to-analog conversion is performed by the digitally controlled timing adjustment circuit 160 to convert $N_C$ into the amount of timing difference that needs to be cancelled. $G_C$ determines a gain factor of the digital-to-analog conversion.

The self-calibrating TDC 190 detects a timing difference between CK3 and CK4 and output $D_{TE}$ to represent the timing difference. The self-calibrating TDC 190 calibrates itself so that a mean value of $D_{TE}$ is zero.

Note that PFD (such as PFD 110 of FIG. 1A) is an example of analog phase detector, while TDC (such as the self-calibrating TDC 190 of FIG. 1A) is an example of digital phase detector.

In an embodiment, a function of the digitally controlled timing adjustment circuit 160 can be described by the following mathematical expression:

$$t_4 - t_3 = t_2 - t_1 + N_C \cdot G_C + t_{OS} \quad (1)$$

Here, $t_1$ is a timing of a rising edge of CK1, $t_2$ is a timing of a rising edge of CK2, $t_3$ is a timing of a rising edge of CK3, $t_4$ is a timing of a rising edge of CK4, and $t_{OS}$ is a timing offset. Here, $t_2 - t_1$ is a timing difference between CK2 and CK1, while $t_4 - t_3$ is a timing difference between CK4 and CK3. Both $S_{TE}$ and $D_{TE}$ represent a relative timing between CK4 and CK3 and is mathematically equal to $t_4 - t_3$. A major difference between $S_{TE}$ and $D_{TE}$ is that $S_{TE}$ is analog but $D_{TE}$ is digital. $N_C$ presents the instantaneous noise in $t_2 - t_1$ due to the modulation of $N_{DIV}$. If $G_C$, which is the conversion gain for converting $N_C$ into the timing difference to be cancelled, is set properly, the noise in $t_2 - t_1$ due to the modulation of $N_{DIV}$ will be corrected and absent in $t_4 - t_3$. On the other hand, if $G_C$ is not set properly, the noise will be either over-corrected or under-corrected, resulting in a residual noise in $t_4 - t_3$ that will become a part of $D_{TE}$. When $G_C$ is set too large (small), the noise will be over-corrected (under-corrected); as a result, $t_4 - t_3$ will contain a residual noise that is positively (negatively) correlated with $N_C$, and therefore $D_{TE}$ will tend to be positive (negative) when $N_C$ is positive and negative (positive) when $N_C$ is negative. Correlation circuit 180 thus adjusts $G_C$ in accordance with a correlation between $N_C$ and $D_{TE}$: when $D_{TE}$ is positively (negatively) correlated with $N_C$, it indicates $G_C$ is too large (small) and needs to be decreased (increased).

Figure 1B:
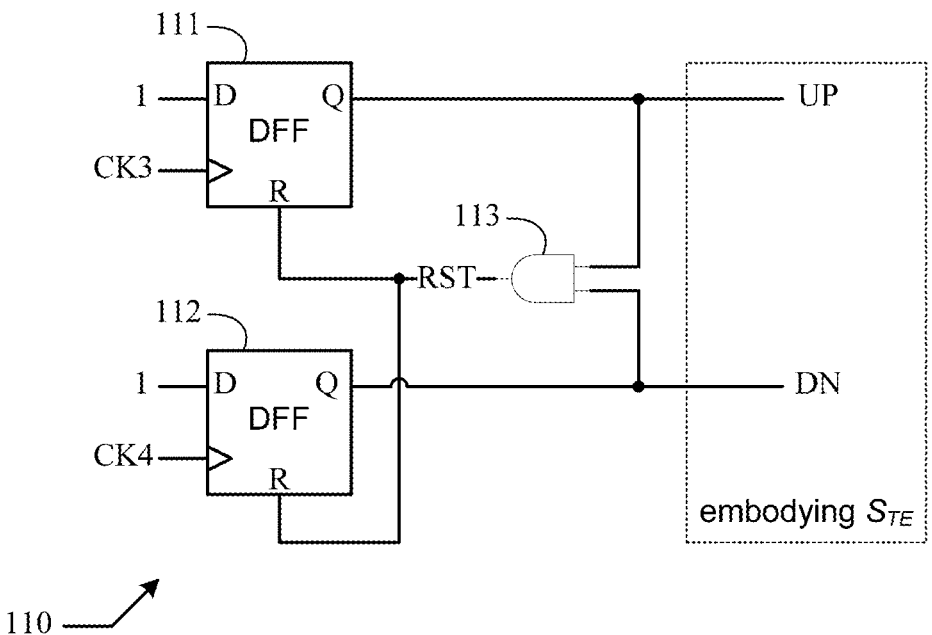
FIG. 1B shows a schematic diagram of a phase/frequency detector.

In an embodiment depicted in FIG. 1B, PFD 110 comprises two data flip-flops (DFF) 111 and 112 and an AND gate 113. Each DFF comprises an input terminal labeled "D," an output terminal labeled "Q," a reset terminal labeled "R," and a clock terminal denoted by a wedge symbol; such notations are widely used in the prior art. DFF 111 outputs a first logical signal UP while DFF 112 outputs a second logical signal DN. The NAND gate 113 receives the two logical signals UP and DN and outputs a reset signal RST. The first (second) logical signal UP (DN) is asserted upon a rising edge of CK3 (CK4) and is de-asserted when the reset signal RST is asserted. The two logical signals UP and DN jointly embody the timing error signal $S_{TE}$ representing a timing difference between CK3 and CK4; such embodiment is widely used and well known in the prior art and thus not explained in detail here.

Figure 1C:
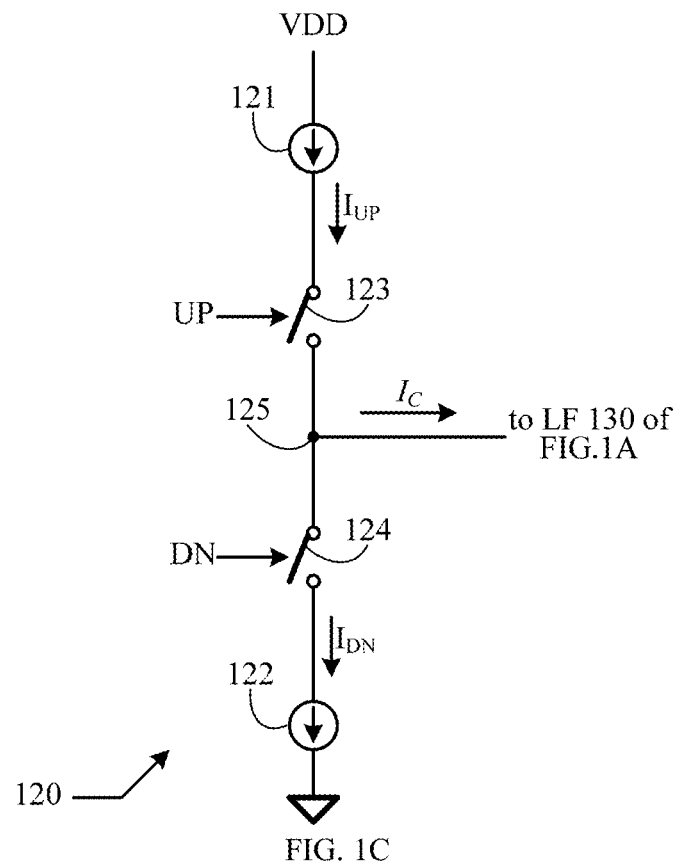
FIG. 1C shows a schematic diagram of a charge pump.

In an embodiment depicted in FIG. 1C, CP 120 comprises a current source 121 configured to source a charge-up current $I_{UP}$, a current sink 122 configured to sink a charge-down current $I_{DN}$, a first switch 123 configured to couple the charge-up current $I_{UP}$ to an output node 125 when the logical signal UP is asserted, and a second switch 124 configured to couple the charge-down current $I_{DN}$ to the output node 125 when the logical signal DN is asserted. The output node 125 interfaces with and provides the correction current $I_C$ to LF 130 of FIG. 1A. Throughout this disclosure, "VDD" denotes a power supply node. FIG. 1C is well known in the prior art and self-explanatory to those of ordinary skills in the art and thus not described in detail here.

Figure 1D:
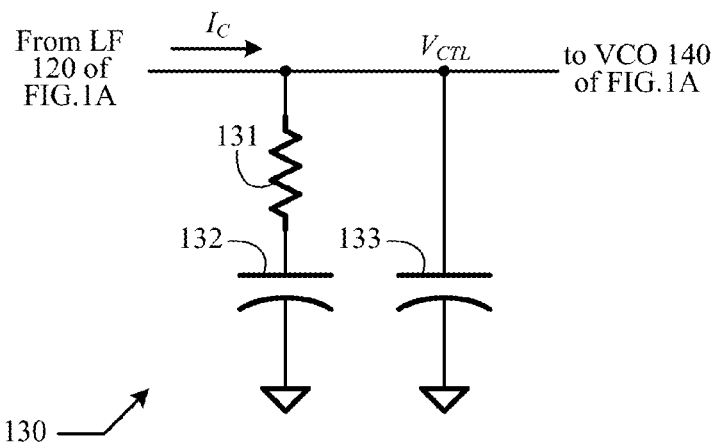
FIG. 1D shows a schematic diagram of a loop filter.

In an embodiment depicted in FIG. 1D, LF 130 comprises a resistor 131, a first capacitor 132, and a second capacitor 133, configured to receive the correction current $I_C$ from CP 120 of FIG. 1A and output the control voltage $V_{CTL}$ to VCO 140 of FIG. 1A. FIG. 1D is well known in the prior art and self-explanatory to those of ordinary skills in the art and thus not described in detail here.

Figure 1E:
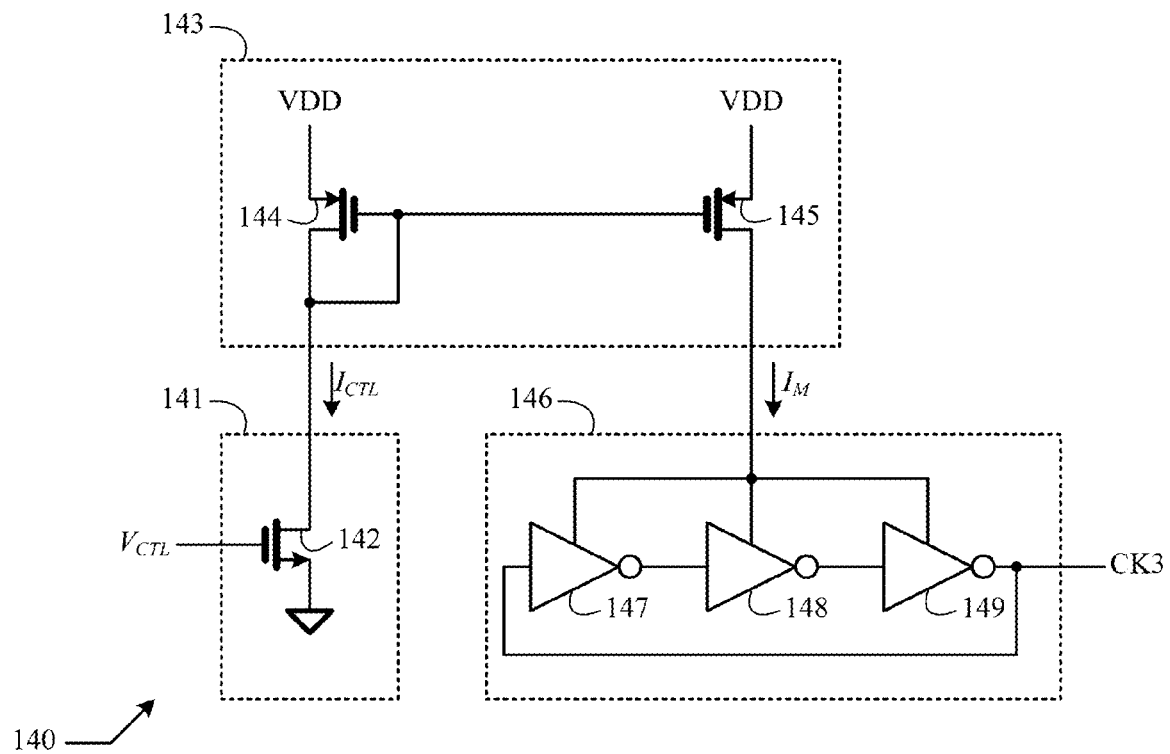
FIG. 1E shows a schematic diagram of a voltage-controlled oscillator.

In an embodiment depicted in FIG. 1E, VCO 140 comprises a voltage-to-current converter 141 configured to convert the control voltage $V_{CTL}$ into a control current $I_{CTL}$, a current mirror 143 configured to mirror the control current $I_{CTL}$ into a mirrored current $I_M$, and a ring oscillator 146 configured to output CK5 in accordance with the mirrored current $I_M$. The voltage-to-current converter 142 comprises a NMOS transistor 142. The current mirror 143 comprises two PMOS transistors 144 and 145. The ring oscillator comprises three inverters 147, 148, and 149 configured in a ring topology, jointly receiving the mirror current $I_M$. When the control voltage $V_{CTL}$ rises, the control current $I_{CTL}$ rises, and so does the mirrored current $I_M$. As a result, the three inverters 147, 148, and 149 receive more power and become faster, resulting in a higher oscillation frequency for CK5.

Clock divider 150 can be embodied by a counter that increments a count upon a rising edge of CK5. The count starts with 0, increments to 1 upon a rising edge of CK5, then increments to 2 upon a next rising edge of CK5, and so on. When the count reaches $N_{DIV}-1$, it wraps around to 0 upon a next rising edge of CK5. In this manner, the counter cyclically counts from 0 to $N_{DIV}-1$. CK2 is asserted whenever the count equals 0, and de-asserted otherwise.

Digitally controlled timing adjustment circuit 160 receives CK1 and CK2 and outputs CK3 and CK4, so that a timing difference between CK4 and CK3 is related to a timing difference between CK2 and CK1 in accordance with a relation described by equation (1). In an embodiment depicted in FIG. 1F, digitally controlled timing adjustment circuit 160 comprises: a fixed-delay circuit 160_1 configured to receive CK2 and output CK4, and a digitally controlled variable-delay circuit 160_2 configured to receive CK1 and output CK3 in accordance with $G_C$ and $N_C$. The fixed-delay circuit 160_1 provides a fixed timing difference between CK4 and CK2; that is, $t_4-t_2$ is fixed. On the other hand, the digitally controlled variable-delay circuit 160_2 provides a variable timing difference between CK3 and CK1 and the variable timing difference is controlled by $G_C$ and $N_C$; that is, $t_3-t_1$ is variable and controlled by $G_C$ and $N_C$. As a result, $t_4-t_3$ is different from $t_2-t_1$ by a variable amount controlled by $G_C$ and $N_C$. In particular, the variable timing difference is linearly dependent on $N_C$, and also linearly dependent on $G_C$. In an embodiment, the fixed-delay circuit 160_1 is simply a short circuit; in this case, the fixed delay is zero and CK3 is the same as CK1. In an alternative embodiment, the fixed-delay circuit is an inverter chain that includes an even number of inverters configured in a cascade topology.

By way of example but not limitation, $N_C$ is a four-bit word comprising four bits $N_C[0]$, $N_C[1]$, $N_C[2]$, and $N_C[3]$. In an embodiment depicted in FIG. 1G, the digitally controlled variable-delay circuit 160_2 comprises: a tunable inverter 161 configured to receive CK1 and output an intermediate clock CKI at a circuit node 165 in accordance with $G_C$; an output inverter 162 configured to receive the intermediate clock CKI and output CK3; and a variable capacitor 166 configured to provide a capacitive load at the circuit node 165. The tunable inverter 161 comprises: a DAC (digital-to-analog converter) 169 configured to receive $G_C$ and output a rail voltage VR; an inverter 168 comprising a PMOS transistor MP and a NMOS transistor MN configured to receive CK1 and output CKI in accordance with the rail voltage VR. The variable capacitor 166 comprises four capacitors 163_0, 163_1, 163_2, and 163_3 configured to conditionally shunt the circuit node 165 to ground via four switches 164_0, 164_1, 164_2, and 164_3 in accordance with $N_C[0]$, $N_C[1]$, $N_C[2]$, and $N_C[3]$, respectively. The output inverter 162 serves as an inverting buffer, and together with the tunable inverter 161 causes CK3 to be the same as CK1 except for a delay. In an embodiment, a capacitance of the variable capacitor 166 increases linearly with a value of $N_C$. When CK1 is low, CKI is high and equal to the rail voltage VR, and CK3 is low. Note that the rail voltage VR is linearly dependent on $G_C$, thanks to the digital-to-analog conversion function of the DAC 169. A low-to-high transition of CK1 will cause the tunable inverter 167 to discharge the variable capacitor 166 via the NMOS transistor MN, resulting in a high-to-low transition of CKI, and consequently a low-to-high transition of CK3. The time that CKI takes to finish the high-to-low transition in response to the low-to-high transition of CK1 is linearly dependent on a total capacitance at the circuit node 175, and also linearly dependent on the rail voltage VR. The capacitance of the variable capacitor is linearly dependent on the value of $N_C$ and the rail voltage VR is also linearly dependent on $G_C$, the time that the intermediate clock CKI takes to finish the transition is approximately linearly dependent on $N_C$ and also linearly dependent on $G_C$. Therefore, digitally controlled timing adjustment circuit 160 can effectively embody equation (1).

The correlation circuit 180 outputs $G_C$ based on a correlation between $D_{TE}$ and $N_C$. In an embodiment, $G_C$ is established in accordance with an algorithm of adaptation described by the following equation $$G_C^{(new)} = \begin{cases} G_C^{(old)} - \mu \cdot D_{TE} & \text{if } N_C > 0 \\ G_C^{(old)} & \text{if } N_C = 0 \\ G_C^{(old)} + \mu \cdot D_{TE} & \text{if } N_C < 0 \end{cases} \quad (2)$$

Here, μ is an adaptation constant, $G_C^{(old)}$ is a value before adaptation, and $G_C^{(new)}$ is a value after adaptation. Since $D_{TE}$ and $N_C$ are purely digital, and equation (2) can be implemented by using a digital signal processing engine. In an embodiment, $G_C$ is a digital signal, and the correlation circuit 180 comprises a digital signal processing unit that adapts $G_C$ in accordance with $D_{TE}$ and $N_C$ using equation (2).

Figure 2:
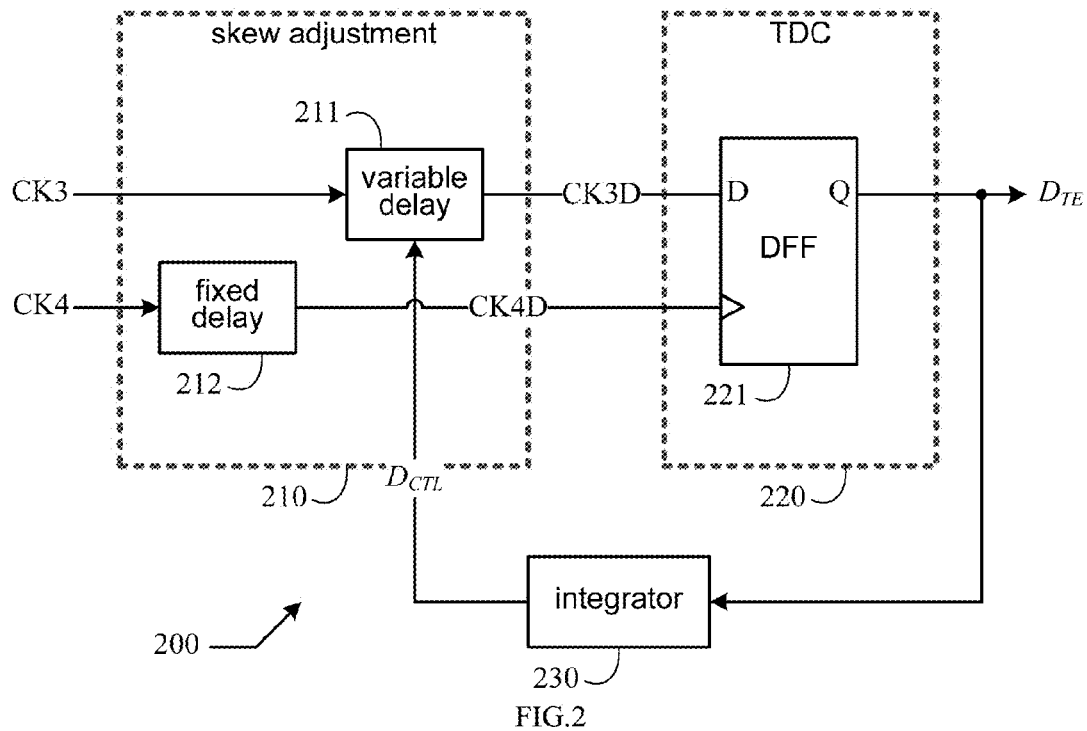
FIG. 2 shows a schematic diagram of a self-calibrating time-to-digital converter.

A functional block diagram of a self-calibrating TDC 200 suitable for embodying the self-calibrating TDC 190 of FIG. 1A is depicted in FIG. 2. Self-calibrating TDC 200 comprises: a skew adjustment circuit 210 configured to receive CK3 and CK4 and output a first delayed clock CK3D and a second delayed clock CK4D in accordance with a delay control signal $D_{CTL}$; a TDC (time-to-digital converter) 220 configured to receive the first delay clock CK3D and the second delayed clock CK4D and output $D_{TE}$; and an integrator 230 configured to receive $D_{TE}$ and output the delay control signal $D_{CTL}$. For brevity, hereafter the first delayed clock CK3D is simply referred to as CK3D, the second delayed clock CK4D is simply referred to as CK4D, and the digital control signal $D_{CTL}$ is simply referred to as $D_{CTL}$. The skew adjustment circuit 210 comprises: a variable delay circuit 211 configured to receive CK3 and output CK3D in accordance with $D_{CTL}$, and a fixed delay circuit 212 configured to receive CK4 and output CK4D. TDC 220 comprises a data flip-flop (DFF) 221 configured to output $D_{TE}$ by sampling CK3D in accordance with CK4D. In this particular embodiment, TDC 220 is a single-bit TDC, wherein $D_{TE}$ is a logical signal that is high (low) when a rising edge of CK3D arrives earlier (later) than a rising edge of CK4D. In the context of digital signal processing, however, $D_{TE}$ is interpreted as a binary signal that is either "1" or "−1," indicating a relative timing (early or late) of CK3D with respect to CK4D. $D_{CTL}$ is an integral of $D_{TE}$. In an embodiment, the fixed delay circuit 212 comprises a cascade of an even number of inverters. In an embodiment, the variable delay circuit 211 is a digital-to-time converter, wherein CK3D is derived from CK3 by delaying CK3 with a delay that is linearly dependent on a value of $D_{CTL}$. Digital-to-time converters are well known in the prior art and thus not described in detailed here. Of the two possible values of $D_{TE}$, if "1" ("−1") occurs more often than "−1" ("1"), the value of $D_{CTL}$ will increase (decrease), and consequently the delay of CK3D will increase (decrease); as a result, the likelihood of CK3D being earlier than CK4D in timing is decreased (increased), so is the likelihood of $D_{TE}$ being "1" ("−1"). $D_{CTL}$ is thus adjusted in a closed loop manner. In a steady state, a mean value of $D_{TE}$ is zero and therefore there is no substantial change to $D_{CTL}$.

Figure 3:
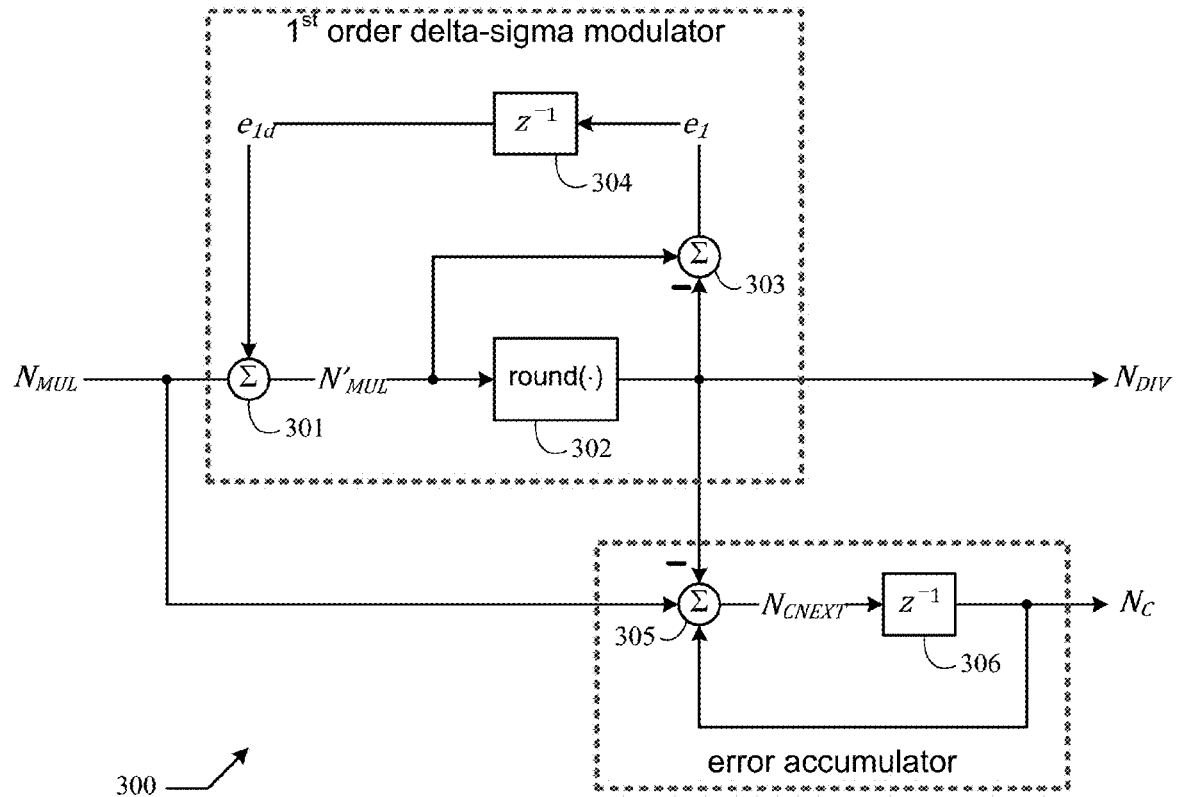
FIG. 3 shows a schematic diagram of a modulator.
Figure 4:
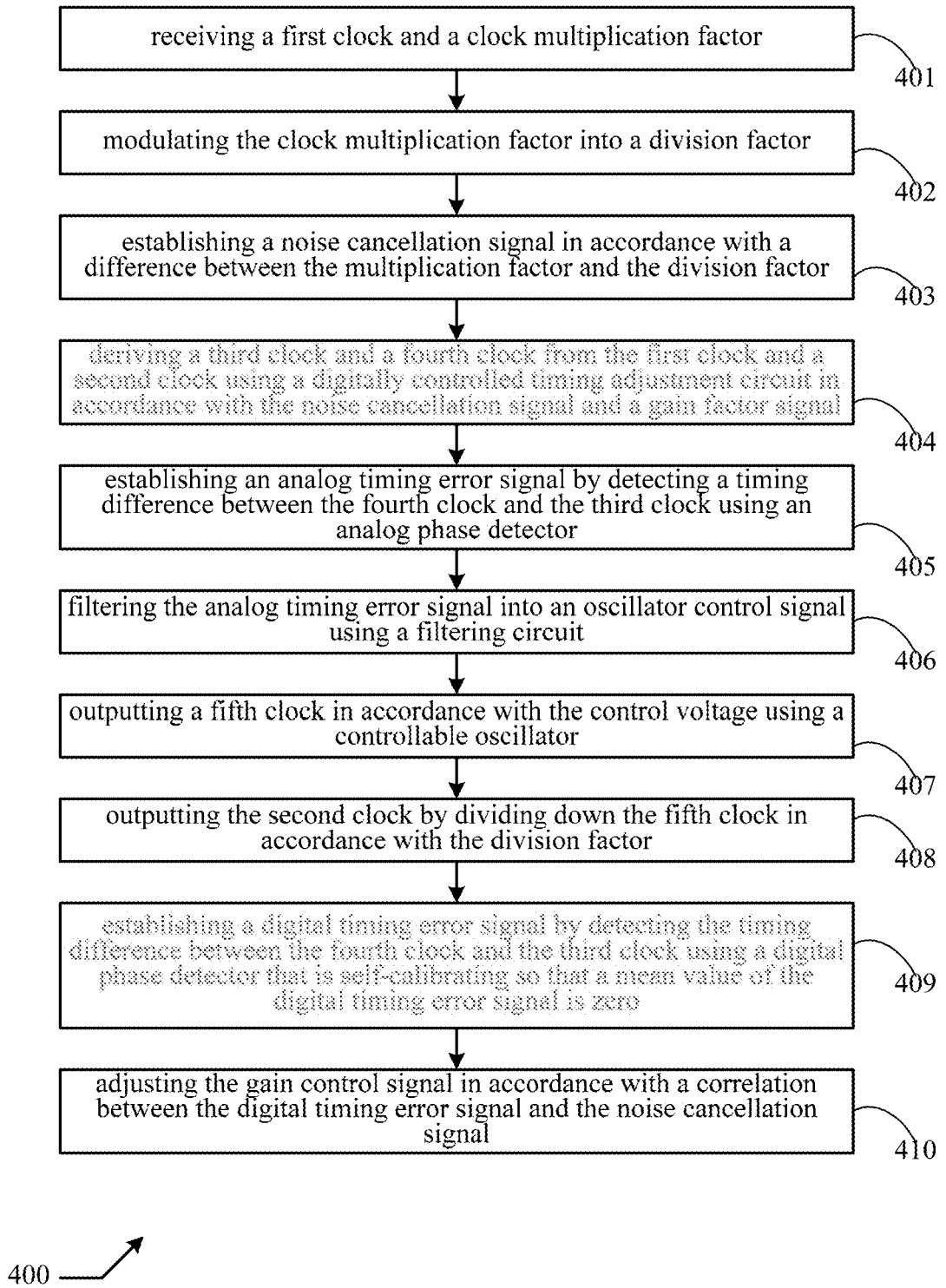
FIG. 4 shows a flow diagram of a method in accordance with the present invention.

In an embodiment, MOD 170 of FIG. 1A is embodied by a modulator 300 depicted in FIG. 3. Modulator 300 comprises a rounding operator (denoted by round(•)) 302, two unit delays (denoted by $z^{-1}$) 304 and 306, and three summing operators 301, 303, and 305. Unit delay 304 receives a rounding error $e_1$ and outputs a delayed rounding error $e_{1d}$. Summing operator 301 sums $N_{MUL}$ and $e_{1d}$ into a modified multiplication factor $N'_{MUL}$. Rounding operator 302 rounds $N'_{MUL}$ into $N_{DIV}$. Summing operator 303 subtracts $N_{DIV}$ from $N'_{MUL}$ to generate $e_1$. Summing operator 305 sums $N_C$ with $N_{DIV}$ and deducts $N_{MUL}$ to output an intermediate signal $G_{CNEXT}$. Unit delay 306 receives $N_{CNEXT}$ and outputs $N_C$. Rounding operator 302, summing operator 301 and 303, and unit delay 304 form a 1st order delta-sigma modulator, so that a mean value of $N_{DIV}$ equals $N_{MUL}$. Summing operator 305 and unit delay 306 form an error accumulator, so that $N_C$ is equal to an accumulative sum of a difference between $N_{DIV}$ and $N_{MUL}$. The difference between $N_{DIV}$ and $N_{MUL}$ is an instantaneous error of the 1st order delta-sigma modulator, and thus an error of the clock dividing operation of the clock divider 150. $N_C$ is the accumulative sum of a difference between $N_{DIV}$ and $N_{MUL}$, represents an accumulative error of the clock dividing operation of the clock divider 150 and thus a timing error of CK2. Digitally controlled timing adjustment circuit 160 corrects the timing error by adjusting the timing difference between CK2 and CK1 with an amount determined by $N_C$.

Figure 1F:
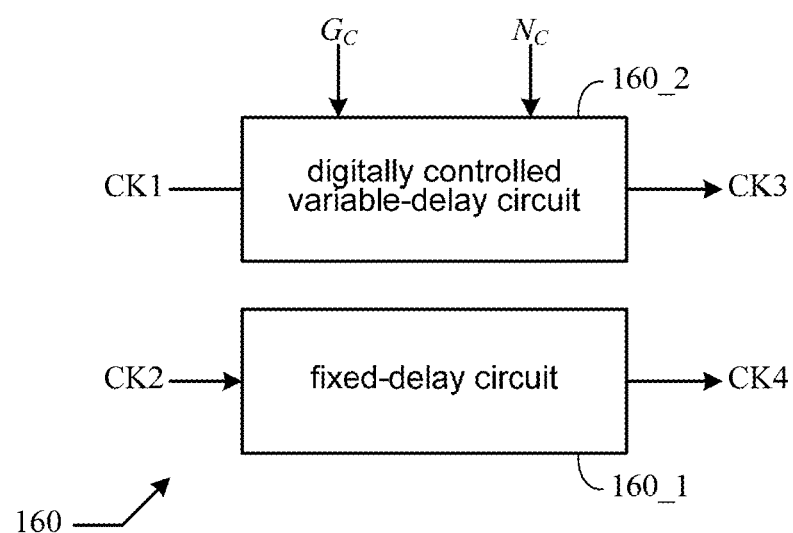
FIG. 1F shows a functional block diagram of a digitally controlled timing adjustment circuit.
Figure 1G:
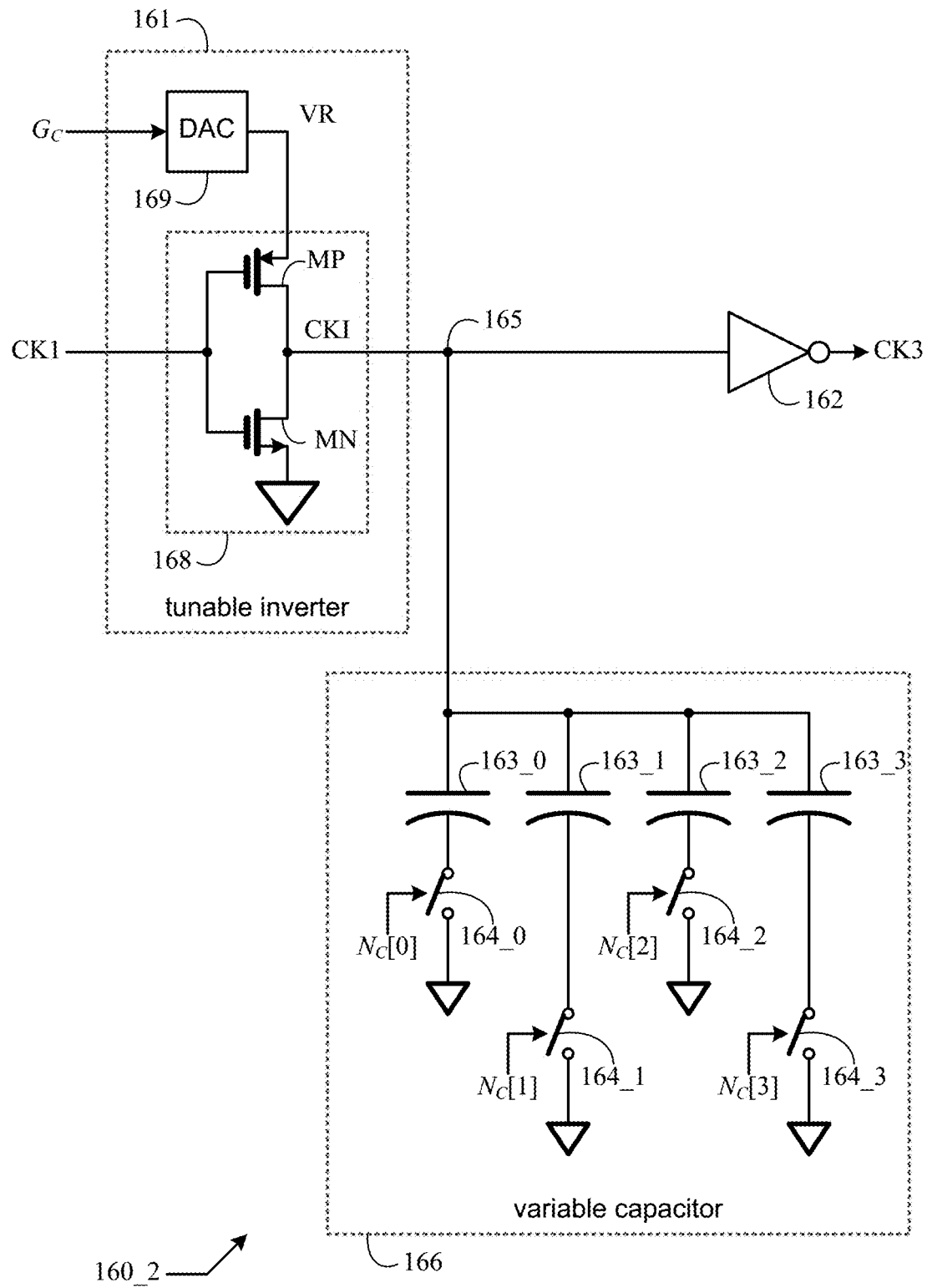
FIG. 1G shows a schematic diagram of a digitally controlled variable-delay circuit.

Now refer to FIG. 1F. In an alternative embodiment not shown in the figure, the fixed-delay circuit 160_1 and the digitally controlled variable-delay circuit 160_2 are swapped, and the digitally controlled variable-delay circuit 160_2 is controlled by $G_C$ and $-N_C$ instead, where $-N_C$ is an inversion of $N_C$. In this alternative embodiment, the timing difference between CK3 and CK1 is fixed and the timing difference between CK4 and CK2 is variable and controlled by $G_C$ and $-N_C$, but the function remains the same and equation (1) is fulfilled.

Still refer to FIG. 1F. The digitally controlled variable-delay circuit 160_2 belongs to a category of circuits known as digital-to-time converters, wherein a timing of an output clock is controlled by a digital signal. The digitally controlled variable-delay circuit 160_2 can be embodied by other digital-to-time converters, as long as the time difference between CK3 and CK1 is linearly dependent on both $N_C$ and $G_C$.

Now refer to FIG. 1A. PFD 110 is merely an exemplary analog phase detector but not a limitation. An alternative phase detector can be used instead, as long as the timing difference between CK4 and CK3 can be detected and properly represented by an associated timing error signal (such as $S_{TE}$). Also, VCO 140 is merely an exemplary controllable oscillator circuit but not a limitation. An alternative controllable oscillator circuit can be used instead, as long as an output clock (such as CK5) can be generated and a frequency of the output clock can be controlled by a control signal (such as $V_{CTL}$). Likewise, CP 120 and the subsequent LF 130 are an exemplary embodiment, but not a limitation, configured to filter an analog timing error signal (such as $S_{TE}$) generated by a preceding analog phase detector (such as PFD 110) into a control signal (such as $V_{CTL}$). An alternative embodiment can be used instead, as long as the analog timing error signal can be filtered into a controllable signal for controlling a subsequent controllable oscillator circuit (such as VCO 140).

In accordance with an embodiment of the present invention, a flow chart 400 of a method comprises: receiving a first clock and a clock multiplication factor (step 401); modulating the clock multiplication factor into a division factor, wherein a mean value of the division factor is equal to the clock multiplication factor (step 402); establishing a noise cancellation signal in accordance with a difference between the clock multiplication factor and the division factor (step 403); deriving a third clock and a fourth clock from the first clock and a second clock using a digitally controlled timing adjustment circuit in accordance with the noise cancellation signal and a gain control signal (step 404); establishing an analog timing error signal by detecting a timing difference between the fourth clock and the third clock using an analog phase detector (step 405); filtering the analog timing error signal into an oscillator control signal using a filtering circuit (step 406); outputting a fifth clock in accordance with the oscillator control signal using a controllable oscillator (step 407); outputting the second clock by dividing down the fifth clock in accordance with the division factor (step 408); establishing a digital timing error signal by detecting the timing difference between the fourth clock and the third clock using a digital phase detector that is self-calibrating so that a mean value of the digital timing error signal is zero (step 409); and adjusting the gain control signal in accordance with a correlation between the digital timing error signal and the noise cancellation signal (step 410).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus comprising:
a digitally controlled timing adjustment circuit configured to receive a first clock and a second clock and output a third clock and a fourth clock in accordance with a noise cancellation signal and a gain control signal;
an analog phase detector configured to receive the third clock and the fourth clock and output an analog timing error signal;
a filtering circuit configure to receive the analog timing error signal and output an oscillator control signal;
a controllable oscillator configured to receive the oscillator control signal and output a fifth clock;
a clock divider configured to receive the fifth clock and output the second clock in accordance with a division factor;
a modulator configured to receive a clock multiplication factor and output the division factor and the noise cancellation signal, wherein a mean value of the division factor is equal to the clock multiplication factor;
a digital phase detector configured to receive the third clock and the fourth clock and output a digital timing error signal, wherein the digital phase detector is self-calibrated so that a mean value of the digital timing error signal is zero; and
a correlation circuit configured to receive the timing error signal and the noise cancellation signal and output the gain control signal.

2. The apparatus of claim 1, wherein a timing difference between the fourth clock and the third clock is equal to a sum of: a timing difference between the second clock and the first clock, the noise cancellation signal scaled by the gain control signal, and a timing offset.

3. The apparatus of claim 1, wherein the digitally controlled timing adjustment circuit comprises: a fixed-delay circuit configured to receive the second clock and output the fourth clock, and a digitally controlled variable-delay circuit configured to receive the first clock and output the third clock in accordance with the noise cancellation signal and the gain control signal.

4. The apparatus of claim 3, wherein a delay of the digitally controlled variable delay circuit is linearly dependent on the noise cancellation signal and also linearly dependent on the gain control signal.

5. The apparatus of claim 3, wherein the digitally controlled variable delay circuit comprises: a tunable inverter comprising an inverter supplied by a rail voltage controlled by the gain control signal, and a variable capacitor controlled by the noise cancellation signal.

6. The apparatus of claim 1, wherein the digital phase detector comprises: a skew adjustment circuit configured to receive the third clock and the fourth clock and output a first delayed clock and a second delayed clock in accordance with a delay control signal, a time-to-digital converter configured to receive the first delayed clock and the second delay clock and output the digital timing error signal, and an integrator configured to receive the digital timing error signal and output the delay control signal.

7. The apparatus of claim 1, wherein the correlation circuit comprises a digital signal processing unit configured to decrement the gain control signal by a value determined by the digital timing error signal if the noise cancellation signal is positive, increment the gain control signal by the value determined by the digital timing error signal if the noise cancellation signal is negative, or make no change to the gain control signal if the noise cancellation signal is zero.

8. The apparatus of claim 1, wherein the analog phase detector comprises a phase/frequency detector.

9. The apparatus of claim 1, wherein the controllable oscillator is a voltage-controlled oscillator.

10. The apparatus of claim 1, wherein the clock divider is a counter.

11. A method comprising:
receiving a first clock and a clock multiplication factor;
modulating the clock multiplication factor into a division factor, wherein a mean value of the division factor is equal to the clock multiplication factor;
establishing a noise cancellation signal in accordance with a difference between the clock multiplication factor and the division factor;
deriving a third clock and a fourth clock from the first clock and a second clock using a digitally controlled timing adjustment circuit in accordance with a noise cancellation signal and a gain control signal;
establishing analog timing error signal by detecting a timing difference between the fourth clock and the third clock using an analog phase detector;
filtering the analog timing error signal into an oscillator control signal using a filtering circuit;
outputting a fifth clock in accordance with the oscillator control signal using a controllable oscillator;
outputting the second clock by dividing down the fifth clock in accordance with the division factor;
establishing a digital timing error signal by detecting the timing difference between the fourth clock and the third clock using a digital phase detector that is self-calibrating so that a mean value of the digital timing error signal is zero; and
adjusting the gain control signal in accordance with a correlation between the digital timing error signal and the noise cancellation signal.

12. The method of claim 11, wherein a timing difference between the fourth clock and the third clock is equal to a sum of: a timing difference between the second clock and the first clock, the noise cancellation signal scaled by the gain control signal, and a timing offset.

13. The method of claim 11, wherein the digitally controlled timing adjustment circuit comprises: a fixed-delay circuit configured to receive the second clock and output the fourth clock, and a digitally controlled variable-delay circuit configured to receive the first clock and output the third clock in accordance with the noise cancellation signal and the gain control signal.

14. The method of claim 13, wherein a delay of the digitally controlled variable delay circuit is linearly dependent on the noise cancellation signal and also linearly dependent on the gain control signal.

15. The method of claim 13, wherein the digitally controlled variable delay circuit comprises: a tunable inverter comprising an inverter supplied by a rail voltage controlled by the gain control signal, and a variable capacitor controlled by the noise cancellation signal.

16. The method of claim 11, wherein the digital phase detector comprises: a skew adjustment circuit configured to receive the third clock and the fourth clock and output a first delayed clock and a second delayed clock in accordance with a delay control signal, a time-to-digital converter configured to receive the first delayed clock and the second delay clock and output the digital timing error signal, and an integrator configured to receive the digital timing error signal and output the delay control signal.

17. The method of claim 11, wherein the correlation operation is performed by a correlation circuit that comprises a digital signal processing unit configured to decrement the gain control signal by a value determined by the digital timing error signal if the noise cancellation signal is positive, increment the gain control signal by the value determined by the digital timing error signal if the noise cancellation signal is negative, or make no change to the gain control signal if the noise cancellation signal is zero.

18. The method of claim 11, wherein the analog phase detector comprises a phase/frequency detector.

19. The method of claim 11, wherein the controllable oscillator is a voltage-controlled oscillator.

20. The method of claim 11, wherein the clock divider is a counter.

\* \* \* \* \*